(12) United States Patent
Parker et al.

(10) Patent No.: US 8,498,162 B2
(45) Date of Patent: Jul. 30, 2013

(54) METHOD, APPARATUS, AND MANUFACTURE FOR FLASH MEMORY WRITE ALGORITHM FOR FAST BITS

(75) Inventors: Allan Parker, Austin, TX (US); Matthew Ronald Croft, Austin, TX (US); Pedro A. Sanchez, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 174 days.

(21) Appl. No.: 13/098,364

(22) Filed: Apr. 29, 2011

(65) Prior Publication Data

US 2012/0275231 A1    Nov. 1, 2012

(51) Int. Cl.
*G11C 16/04* (2006.01)
(52) U.S. Cl.
USPC ............. 365/185.28; 365/185.03; 365/185.19
(58) Field of Classification Search
USPC .................................................. 365/185.28
See application file for complete search history.

(56) References Cited

U.S. PATENT DOCUMENTS

| | | | | |
|---|---|---|---|---|
| 5,943,260 A * | 8/1999 | Hirakawa | ................. | 365/185.03 |
| 5,991,201 A * | 11/1999 | Kuo et al. | ................. | 365/185.19 |
| 6,343,033 B1 * | 1/2002 | Parker | ...................... | 365/185.19 |
| 7,324,374 B2 | 1/2008 | Shieh et al. | | |
| 7,372,732 B2 * | 5/2008 | Wu | ........................... | 365/185.03 |
| 7,577,034 B2 * | 8/2009 | Lee et al. | ................. | 365/185.19 |
| 7,656,710 B1 * | 2/2010 | Wong | ....................... | 365/185.19 |
| 8,045,384 B2 * | 10/2011 | Dong et al. | ............. | 365/185.17 |
| 8,179,726 B2 * | 5/2012 | Yu et al. | ................... | 365/185.19 |
| 2009/0080263 A1 * | 3/2009 | Lee et al. | ................. | 365/185.19 |
| 2010/0322005 A1 * | 12/2010 | Dong et al. | ............. | 365/185.17 |

OTHER PUBLICATIONS

U.S. Appl. No. 13/098,378, filed on Apr. 29, 2011 by Allan Parker for "Method and Apparatus for Temperature Compensation for Programming and Erase Distributions in a Flash Memory".

* cited by examiner

*Primary Examiner* — Son Mai
(74) *Attorney, Agent, or Firm* — Sterne, Kessler, Goldstein & Fox P.L.L.C.

(57) ABSTRACT

A method, apparatus, and manufacture for a memory device is provided. The memory device includes memory cells that each store two bits, and a memory controller. During write operations, for each bit in each memory cell that is to be programmed, the memory controller determines whether both bits of the memory cell are being programmed. While controlling an application of programming pulses to the memory cell to program the bit, if both bits of the memory cell are being programmed, the memory controller causes the application of each programming pulse to the bit to occur for a reduced duration. Otherwise, the memory controller causes the application of each programming pulse to the bit to occur for a standard duration. The reduced duration is less than three-fourths of the standard duration.

13 Claims, 5 Drawing Sheets

METHOD, APPARATUS, AND MANUFACTURE FOR FLASH MEMORY WRITE ALGORITHM FOR FAST BITS

TECHNICAL FIELD

The invention is related to computer-readable memory, and in particular, but not exclusively, to a method, apparatus, and manufacture and for a write algorithm for writing fast bits in a dual cell flash memory.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different types of flash memory, including NOR flash and NAND flash.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, the invention is related to a method, apparatus, and manufacture for a memory device. The memory device includes memory cells that each store two bits, and a memory controller. During write operations, for each bit in each memory cell that is to be programmed, the memory controller determines whether both bits of the memory cell are being programmed. While controlling an application of programming pulses to the memory cell to program the bit, if both bits of the memory cell are being programmed, the memory controller causes the application of each programming pulse to the bit to occur for a reduced duration. Otherwise, the memory controller causes the application of each programming pulse to the bit to occur for a standard duration. The reduced duration is less than three-fourths of the standard duration.

Figure 1:
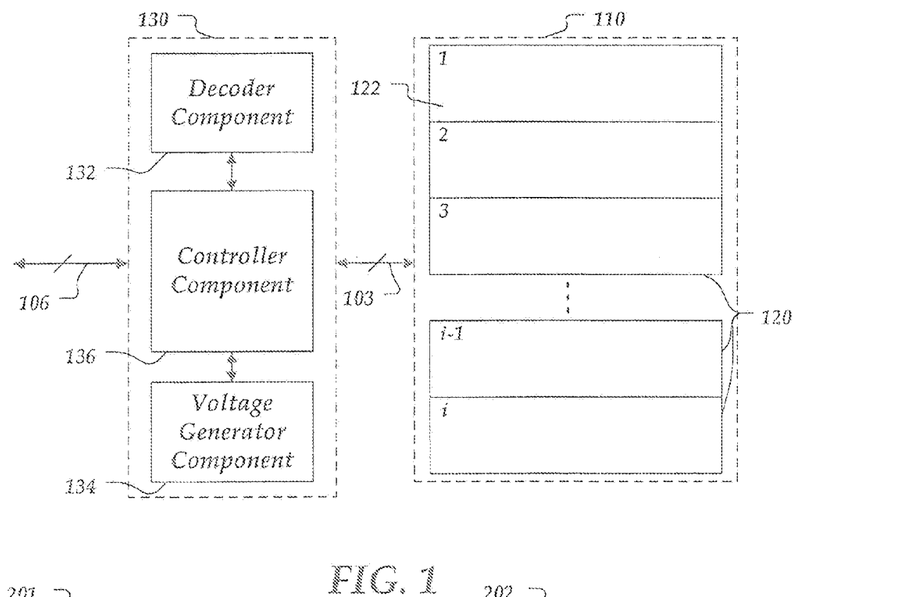
FIG. 1 illustrates a block diagram of an embodiment of a memory.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although some embodiments of the invention described in the context of a MirrorBit™ NOR flash memory, the fabrication described herein may be employed in manufacturing other types of microelectronic memories or devices such as other various types of flash memory.

As shown, memory 100 includes arrayed memory 110 and memory controller 130. Memory controller 130 is arranged to communicate addressing data and program data over signal path 106. For example, signal path 106 can provide 8, 16, or more I/O lines of data. Memory controller 130 is also configured to access arrayed memory 110 over signal path 103. For example, memory controller 130 can read, write, erase, and perform other operations at portions of arrayed memory 110 via signal path 103. In addition, although shown as single lines, signal path 103 and/or signal path 106 may be distributed across a plurality of signal lines and/or bus lines.

Arrayed memory 110 includes memory sectors 120 (identified individually as sectors 1-*i*) that can be accessed via memory controller 130. Memory sectors 120 can include, for example, 256, 512, 1024, 2048 or more sectors having memory cells that can be individually or collectively accessed. In other examples, the number and/or arrangement of memory sectors can be different. In one embodiment, for example, sectors 120 can be referred to more generally as memory blocks and/or can be configured to have a configuration that is different than a bit line, word line, and/or sector topology.

Memory controller 130 includes decoder component 132, voltage generator component 134, and controller component 136. In one embodiment, memory controller 130 may be located on the same chip as arrayed memory 110. In another embodiment, memory controller 130 may be located on a different chip, or portions of memory controller 130 may be located on another chip or off chip. For example, decoder component 132, controller component 134, and voltage generator component 136 can be located on different chips but co-located on the same circuit board. In other examples, other implementations of memory controller 130 are possible. For example, memory controller 130 can include a programmable microcontroller.

Decoder component 132 is arranged to receive memory addresses via addressing signal path 106 and to select individual sectors, arrays, or cells according to the architecture of arrayed memory 110.

Decoder component 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator component 134 is arranged to receive one or more supply voltages (not shown) and to provide a variety of reference voltages required for reading, writing, erasing, pre-programming, soft programming, and/or under-erase verifying operations. For example, voltage generator component 134 can include one or more cascode circuits, amplifier circuits, regulator circuits, and/or switch circuits that can be controlled by controller component 136.

Controller component 136 is arranged to coordinate reading, writing, erasing, and other operations of memory 100. In one embodiment, controller component 136 is arranged to receive and transmit data from an upstream system controller (not shown). Such a system controller can include, for example, a processor and a static random access memory (SRAM) that can be loaded with executable processor instructions for communicating over signal path 106. In another embodiment, controller component 136 as well as other portions of memory controller 130 may be embedded or otherwise incorporated into a system controller or a portion of a system controller. The memory controller may include a processor-readable medium having processor-executable code encoded therein, which when executed by one or more processors in memory controller 130, enables actions.

Embodiments of controller component 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

In some embodiments, memory 100 is a flash-based memory including flash-based memory cells, such as flash-based NAND cells, NOR cells, or hybrids of the two. Memory 100 is a dual cell memory in which each memory cell 103 stores two bits. Memory controller 130 is arranged to perform program operations to bits to a memory cell 103 so that programming a bit is different if a 00 is being programmed to a memory cell. If a 00 is being programmed to the cell, the programming pulses used to program the bit are shorter in duration than the programming pulse used for a 01 or a 10, where 0 is the programmed state and 1 is the unprogrammed state. Memory controller 130 may determine whether or not the cell is being programmed to a 00 by means of a data look-ahead, such as a buffer which includes the data which is to be programmed.

Figure 2:
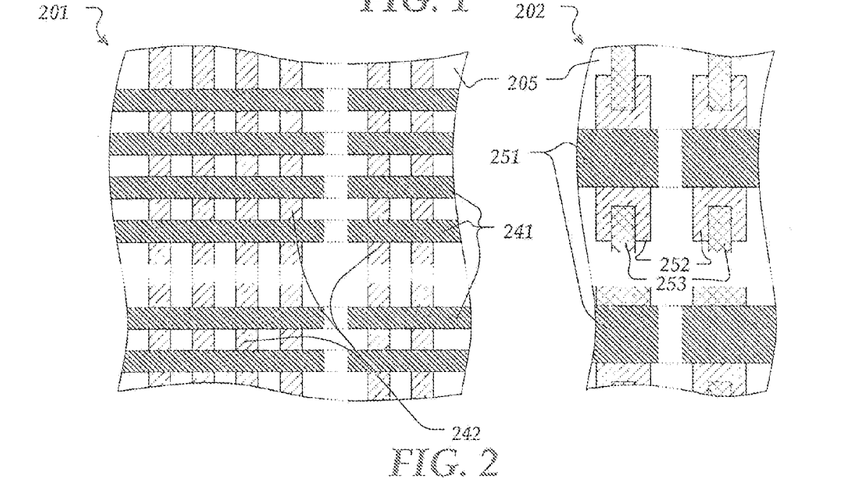
FIG. 2 shows a partial top plan view of an embodiment of core and peripheral sections of a memory that may be employed in the memory of FIG. 1.

FIG. 2 shows a partial top plan view of separate sections of a memory. Core section 201, for example, may be an embodiment of a portion of sector 120 of FIG. 1 and may include arrayed core memory cells. Peripheral section 202, for example, may be an embodiment of memory controller 110 of FIG. 1 or a portion of memory controller 110 of FIG. 1.

Core section 201 includes core polysilicon lines 241, conductive regions 242, and a portion of substrate 205. Portions of core polysilicon lines 241 are coupled to the gates of individual memory cells (not shown in FIG. 2) and can be configured as a word line, a source select gate line, and/or a drain select gate line. Portions of conductive regions 242 can include, for example, p-type and/or n-type doped regions of substrate 205 for forming source/drain regions and/or conductive lines. For example, conductive regions 242 can form portions of bit lines and/or other signal lines. Also, in some embodiments, individual conductive regions 242 extend at least partially underneath individual core polysilicon lines 241.

In one embodiment, core section 201 is arranged in a NOR topology, and individual memory cells can be individually accessed via individual conductive regions 242. In another embodiment, core section 201 is arranged in a NAND topology, and individual memory cells can be accessed though individual conductive regions 242 collectively but not individually. In other embodiments, hybrid architectures can be employed. For example, core section 201 can be configured to have a portion that is NAND-based and another portion that is NOR-based. Also, although not shown in FIG. 2, core section 201 may include any of a variety of interconnect and/or passivation layers, such as dielectric, conductive, or other layers. For example, conductive regions 242 can be positioned beneath a dielectric spacer layer.

Peripheral section 202 includes peripheral polysilicon lines 251, conductive regions 252, and interconnects 253. Portions of peripheral polysilicon lines 251 are coupled to individual peripheral devices (not shown in FIG. 2).

Portions of conductive regions 252 can include, for example, p-type and/or n-type doped regions of substrate 205 for forming conductive features, such as a source, a drain, or other type of well. Interconnects 253 can include conductive lines that electrically intercouple portions of peripheral section 202 and/or electrically couple core section 201 with peripheral section 202. For example, interconnects 253 can include a combination of metal lines and vias. Also, although not shown in FIG. 2, peripheral section 202 may also include any of a variety of other interconnect and/or passivation layers.

Figure 3:
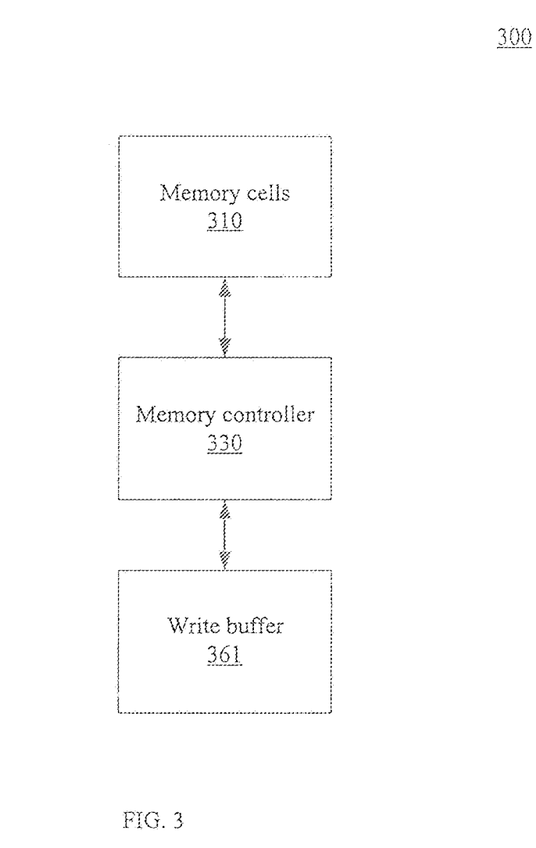
FIG. 3 illustrates a block diagram of an embodiment of the memory device of FIG. 1.

FIG. 3 illustrates a block diagram of an embodiment of memory device 300. Memory device 300 includes write buffer 361, memory controller 330, and memory cells 310.

Memory cells 310 include a number of memory cells, in which each memory cell is configured to store two bits. Memory controller 330 is configured to control write operations to memory cells 310. For each bit in each memory cell in memory cells 310 that is to be programmed, memory controller 330 determines whether or not both bits of the memory cell are being programmed. For example, memory controller 330 may use write buffer 361 to make this determination. During programming, memory controller 330 controls the application of a plurality of programming pulses to the memory cell in memory cells 310 to program the bit. The duration of the programming duration depends on whether or not both bits of the memory cell are being programmed. If both bits are being programmed, the duration is less then ¾ the duration of that used when only one of the two bits is being programmed. For example, in some embodiments, the duration of the programming pulse when both bits are being programmed is about half the duration of the programming pulse used when a 01 or a 10 is being programmed to the memory cell.

Write buffer 361 may include all of the bits that are being programmed to each of the memory cells 310, or to a portion of the memory cells 310. In some embodiments, during programming, a programming pass is the left side of each memory cell in memory cells 310 that is to be programmed occurs first, and a programming pass to the right side of each memory cell that is to be programmed in memory cells 310 occurs subsequently. However, when programming one side of the cells, the information about whether the other side of the cell is also being programmed is included in the write buffer. In some embodiments, write buffer 361 is a page buffer that contains the requested data for a user.

Figure 4:
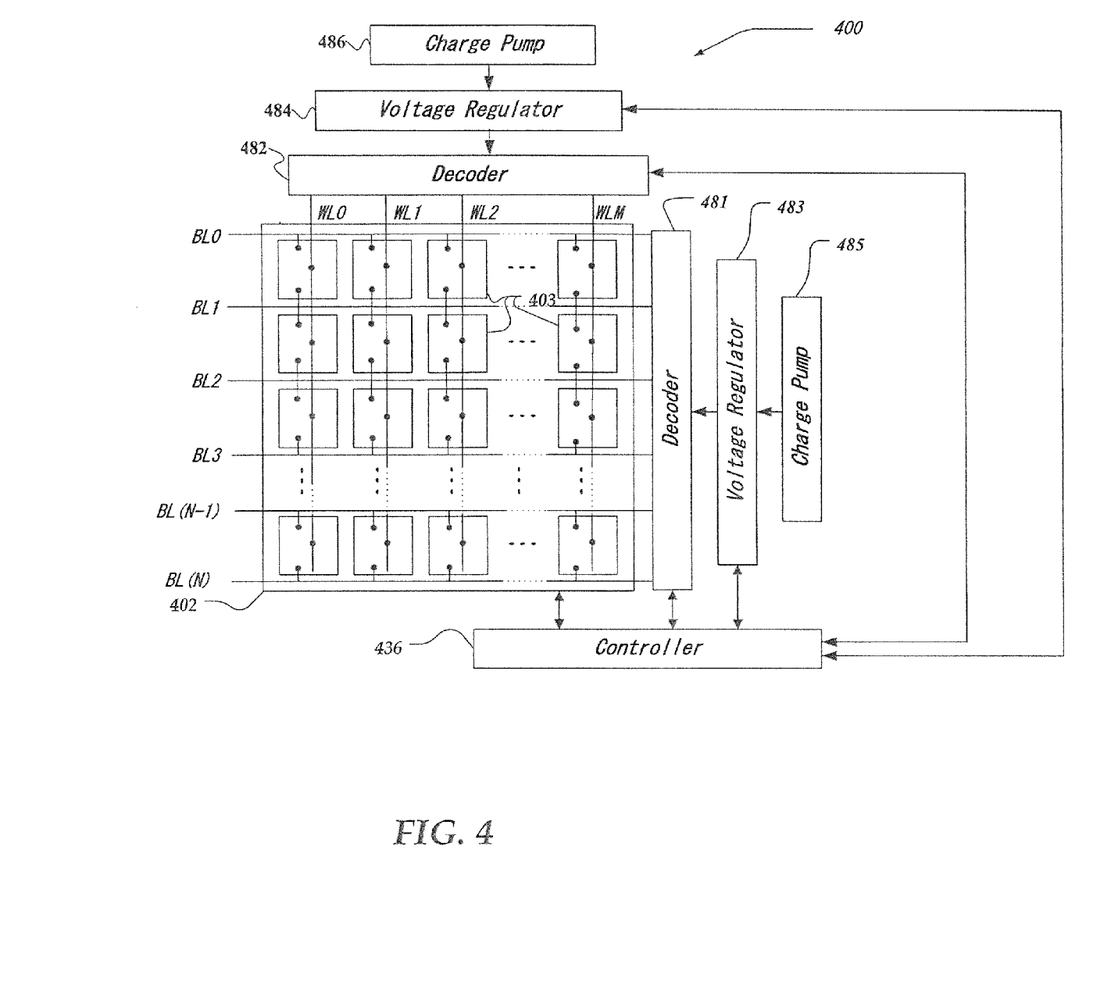
FIG. 4 shows a block diagram of an embodiment of the memory device of FIG. 1 or FIG. 3.

FIG. 4 illustrates a block diagram of an embodiment of memory device 400, which may be employed as an embodiment of memory device 300 of FIG. 3. Memory device 400 includes memory array 402 and individual memory cells 403 located within memory array 402. Memory cells 403 are arranged in N+1 rows and M+1 columns in memory array 402. In one embodiment, each row of memory array 402 is accessed by two of the bit lines BL0 to BLN. Each column of memory array 402 is accessed by one of word lines WL0 to WLM. Accordingly, each of memory cells 403 can be accessed by activating the corresponding bit lines and a corresponding word line of the cell. In one embodiment, each column of memory array 402 defines a data word. If N+1 has a value of 8, for example, the cells in each column of memory array 402 define a byte of data.

Each memory cell 401 is a dual cells device. In some embodiments, flash memory stores information in an array of memory cells made from floating-gate transistors. In, for example, a NOR gate flash, the transistors resemble a standard metal-oxide-semiconductor field-effect transistor ("MOSFET") except that the transistor has two gates, a floating gate and a control gate, instead of one. On top is the control gate ("CG"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("$V_T$") of the cell. The threshold voltage of a MOSFET is usually defined as the gate voltage where an inversion layer forms at the interface between the insulating layer (oxide) and the substrate (body) of the transistor. During read-out, a voltage is applied to the CG, and the MOSFET channel will become conducting or remain insulating, depending on the $V_T$ of the cell, which is in turn controlled by the charge on the FG. The current flow through the MOSFET channel is sensed which permits a determination of the voltage threshold for the device, which in turn provides information about the binary data stored within the device.

Each control gate stores two charge amounts that represent the stored information. That is, two physically distinct quantities of charge are stored on opposite sides of the floating gate. Reading or writing data on one side of the floating gate occurs independently of the data that is stored on the opposite side of the floating gate. In this technology, the FG is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layers. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

Memory device 400 further includes controller 436, decoder 481, decoder 482, voltage regulator 483, voltage regulator 484, charge pump 485, and charge pump 486.

Charge pump 485 is arranged to provide a boosted bit line voltage. Charge pump 486 is arranged to provide a boosted word line voltage. Voltage regulator 483 is arranged to receive the boosted voltage from charge pump 485, and to provide an adjusted boosted bit line voltage based on control from controller 436. Similarly, voltage regulator 484 is arranged to receive the boosted voltage from charge pump 486, and to provide an adjusted boosted word line voltage based on control from controller 436.

Decoder 481 and decoder 482 can each receive address bus information from controller 436 and can utilize such information to facilitate accessing or selecting the desired memory cell(s) (e.g., memory location(s)) associated with the command, and to provide the needed voltages to the bit lines (decoder 481) and the word lines (decoder 482) according to timing that is controlled by controller 436.

Decoder 481 may also include a sector decoder in some embodiments. As such, decoder 409 may be arranged to facilitate accessing or selection particular column or grouping of columns within memory device 400. For example, a grouping of columns may define a sector, and another grouping of columns may define another sector. In another embodiment, portion 401 may include an array decoder for a particular memory array 402. In addition, embodiments of array decoders can be configured to work separately or in conjunction with a sector decoder.

Memory controller 436 is also configured to control the activation and de-activation individual word lines WL0 to WLM for reading, writing, and/or erasing to memory array 402. For example, memory controller 410 can provide a select signal to decoder 482 to select one of the columns WL1 to WLM to activate that column. Further, memory controller 436 can provide a select signal to decoder 481 for selecting particular rows BL0 to BLN (or sector) to be written to or read from.

In one embodiment, program operations to a particular memory cell 403 are performed as follows. Controller 436 is arranged to cause a boosted voltage provided by voltage regulator 481 to be coupled to the appropriate bit line for the memory cell, and to cause a boosted voltage provided by voltage regulator 484 to be coupled to the appropriate word line for the memory cell. The side of the memory cell 403 that is being programmed receives the boosted bit line voltage, and the other side of the memory cell 403 that is being programmed is being grounded.

In some embodiments, during programming operations, for each programming pass, a programming pass occurs to the left sides of the memory cells first, and the right sides subsequently. As memory controller 403 is performing programming of the left side bits, for each left-side bit that is being programmed, the boosted word line voltage is applied to the control gate of the memory cell, the boosted bit line voltage is applied to the left side of the memory cell, and the right side of the memory cell is grounded. In some embodiments, the boosted word line voltage is applied prior to the boosted bit line voltage. However, application of the word line voltage, by itself, has little effect on the programming of the cell. After the word line voltage is applied to the memory cell, the bit line voltage is applied. In some embodiments, the boosted word line voltage is about 8 or 9 volts, and the boosted bit line voltage is about 5 volts. When both the boosted word line voltage and the boosted bit line voltage are applied to the memory cell, it is the beginning of the programming pulse.

These voltages are provided to the memory cell 403 for a particular period of time. In some embodiments, the standard duration to which these voltages are provided is a fixed, pre-configured period of time. In other embodiments, this standard duration may be adjusted based on temperature and/or other factors. The standard duration is used if the cell is being programmed to a 01 state or a 10 state. If the cell is being programmed to a 00 state, a reduced duration is used, which is less than ¾ of the standard duration. In some embodiments, the reduced duration is approximately half of the standard duration. In some embodiments, the standard duration is about 200 ns, and the reduced duration is about 100 ns. In some embodiments, memory controller determines whether or not the cell is being programmed to a 00 state by means of a buffer which indicates the state to which each memory cell is being programmed. For example, the user data may be stored in a page buffer. The page buffer remains intact during the entire program sequence.

At a time after the pulse is complete, a program-verify is performed to determine whether or not the threshold voltage of the cell has reached the appropriate voltage to be a programmed bit. If so, the programming of the bit is complete. There may be a separate buffer that represents the verify data. During the verify step, it is verified whether the bit matches the requested sequence in the verify buffer.

After the left side bits to be programmed receive programming pulses, the right side bits to be programmed receive programming pulses in substantially the same way, with the difference being that, for each right-side bit that is to be programmed, the right side of the cell received the boosted bit line voltage, and the left side of the cell is grounded.

After programming pulses are applied to both sides of the memory sides, if not all of the cells to be programmed are successfully programmed yet, similar repeated pulses are performed (again, with alternating left-side and right side passes), until either a program-verify is successful, or the operation times out.

In order to obtain tight VT distribution, it is preferred that programming of each bit requires about four to eight programming pulses. Programming of each left bit is largely an independent process from the programming of the right bit of the same memory cell. However, if programming of each bit of a cell were identical in the case where the cell is being programmed to a 00 as to when it was being programmed to a 01 or a 10, with the programming pulse not shortened in the 00 case, it would typically take only about two programming pulses to program each bit, and the cell would frequently be over-programmed. By reducing the pulse duration in the 00 case as discussed above, each bit should typically take the standard four to eight programming pulses to program.

Adjusting the duration of the programming pulses may be accomplished in different ways in different embodiments. In some embodiments, there are two separate clock sources, one for the standard duration, and one for the reduced duration. The clock for the standard duration is normally used for the timing of the programming logic for the programming pulses. However, if memory controller 430 determines that the cell is being programmed to a 00, the other clock source is used for the programming pulse logic.

In some embodiments, memory device 400 is monolithic, and all of the devices illustrated in FIG. 4 are located together on the same chip. In other embodiments, some of the components illustrated in FIG. 4 may be located on a different chip, or portions of some of the devices may be located on a different chip. Some of the devices may be located on different chips but co-located on the same circuit board.

In some embodiments, some portions of the memory space may be configured in "single-ended" mode. In this configuration, all mirror bit cells within the selected space are used as a single bit (instead of two bits). Also, in this configuration, each cell has either an 11 or 00 state—the 10 and 01 states are not used. With this setup, read accesses can be reliably performed in a slightly expanded temperature and supply voltage range with reduced probability of errors. When a program is issued within this space, the microcontroller automatically negotiates the selection and programming of the "backside" of each of the selected single-ended cells and is transparent to the user. User reads would then only access these cells in one direction.

For example, in some embodiments, a single-ended configuration may be used in extended/hidden array sectors where the microcontroller executable code is stored. This code can be reliably read from the flash array during power up sequences (single-ended reads have greater read margin and thus are less likely to experience read errors) and moved into on-chip SRAM for fast execution.

In a single-ended configuration, a write operation is being performed to a zero state, so for memory in the single-ended configuration, there is no need to make a separate check to determine whether both bits of the memory cell are being programmed—for memory in a single-ended configuration, when one bit of the memory cell is being programmed, both bits are being programmed.

Modern semiconductor devices are typically created as integrated circuits manufactured on the surface of a substrate of semiconductor material. The processing begins by growing a wafer, which is typically done using the Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that exposes light through photomasking, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design. Various design tools may be used by the designer in creating the design, simulating the design, and checking the design for layout rules violations. When completed, the design files are provided to the fabricator, which are used to generate photomasks for use in fabricating the device. The design files may be communicated in different ways, including over a network.

Figure 5:
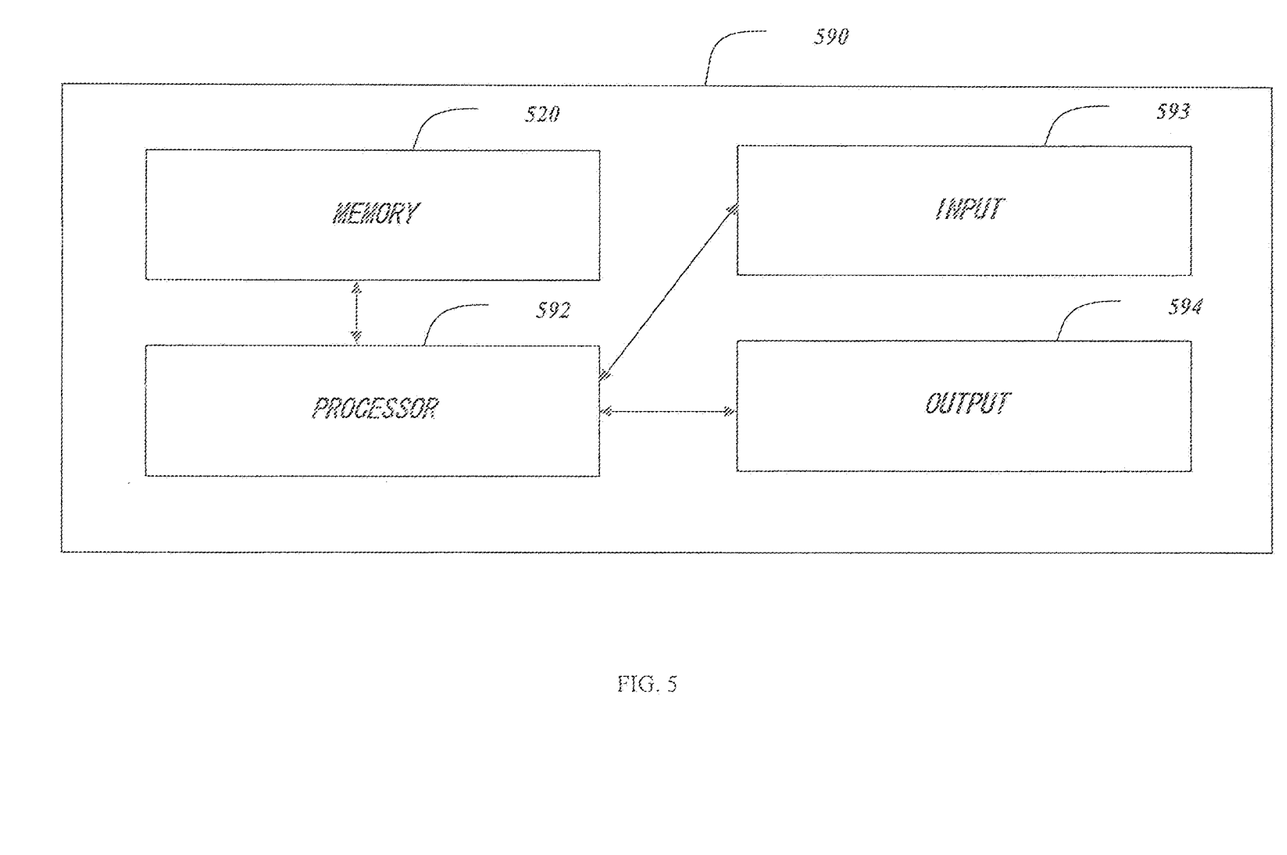
FIG. 5 illustrates a block diagram of an embodiment of a system that includes the memory device of FIG. 4.

Embodiments of memory device 400 of FIG. 4 can be incorporated into any of a variety of components and/or systems, including for example, a processor and other components or systems of such components. FIG. 5 shows one embodiment of system 590, which may incorporate memory 520, which is an embodiment of memory device 400 of FIG. 4. Memory 520 can be directly or indirectly connected to any one of processor 592, input devices 593, and/or output devices 594. In one embodiment, memory 520 may be configured such that it is removable from system 590. In another embodiment, memory 520 may be permanently connected to the components or a portion of the components of system 590.

In many embodiments, memory 520, processor 592, input devices 593, and/or output devices 594 of system 590 are configured in combination to function as part of a larger system. For example, system 590 may be incorporated into a cell phone, a handheld device, a laptop computer, a personal computer, and/or a server device. In addition or alternatively, system 590 can perform any of a variety of processing, controller, and/or data storage functions, such as those associated with sensing, imaging, computing, or other functions. Accordingly, system 590 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

Figure 6:
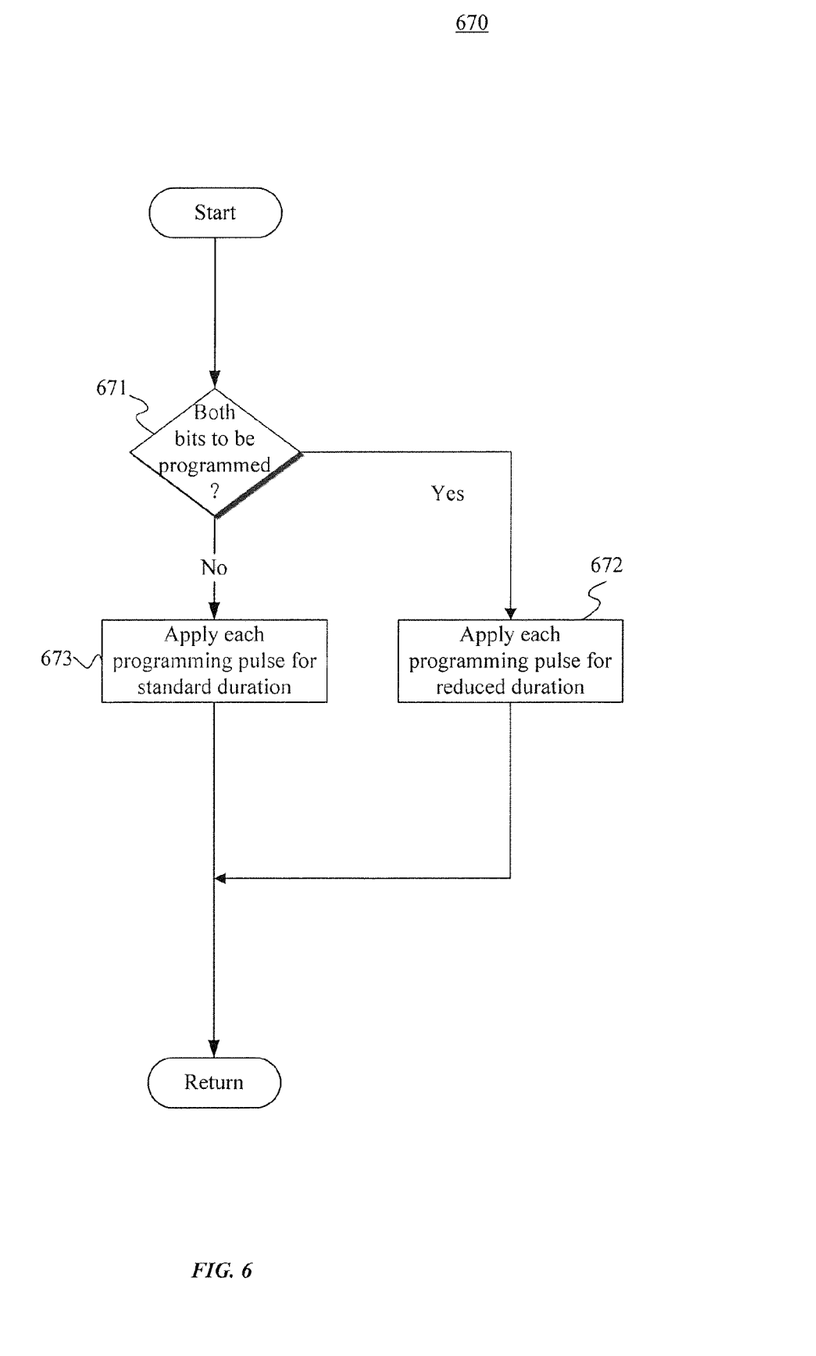
FIG. 6 shows a flowchart of an embodiment of a process that may be employed by the memory device of FIG. 1, FIG. 3, and/or FIG. 4, in accordance with aspects of the invention.

FIG. 6 shows a flowchart of an embodiment of process 670, which may be employed by an embodiment of memory device 400 of FIG. 4. Process 670 is a process for controlling write operations to the memory cells, which may be performed for each bit in each memory cell that is to be programmed. After a start block, the process proceeds to decision block 671, where a determination is made as to whether both bits of the memory cell are being programmed. If the determination at decision block 671 is positive, the process advances to block 672, where the application of each programming pulse to the bit is caused to occur for a reduced duration. The process then moves to a return block, where other processing is resumed. If the determination at decision block 671 is negative, the process proceeds to block 673, where the application of each programming pulse to the bit is caused to occur for a standard duration. The process then advances to the return block.

What is claimed is:

1. A memory device, comprising:
a plurality of memory cells, wherein each memory cell is configured to store two bits; and
a memory controller that is configured to control write operations to the plurality of memory cells by performing actions, including, for each bit in each memory cell of the plurality of memory cells that is to be programmed:
determining whether both bits of the memory cell are being programmed; and
controlling an application of a plurality of programming pulses to the memory cell to program the bit, wherein
if both bits of the memory cell are being programmed causing the application of each programming pulse to the bit to occur for a reduced duration
else
causing the application of each programming pulse to the bit to occur for a standard duration, wherein the reduced duration is less than three-fourths of the standard duration.

2. The memory device of claim 1, wherein
the memory controller is configured to employ a page buffer to determine whether both bits of the memory cell are being programmed.

3. The memory device of claim 1, wherein
the memory controller is configured such that the reduced duration is about half of the standard duration.

4. The memory device of claim 1, wherein
the memory controller is further configured to control the application of the plurality of programming pulses by, if both bits of the memory cell are being programmed, employing a first clock source for programming logic for applying the programming pulse, else employing a second clock source for programming logic for applying the programming pulse.

5. The memory device of claim 1, wherein
the memory controller is configured such that the standard duration is a fixed, constant duration.

6. The memory device of claim 1,
the memory controller is configured such that the standard duration varies based on temperature.

7. The memory device of claim 1, wherein
the memory controller is configured such that controlling the application of the plurality of programming pulses to the memory cells includes:
controlling an application of a first programming pulse of the plurality of programming pulses to the memory cell by:
controlling an application of a boosted word line voltage to the memory cell; and
controlling an application of a boosted bit line voltage to the memory cell;
performing a program verify to determine whether or not the bit has been programmed; and
if it is determined that the bit has not been programmed, controlling an application of another programming pulse of the plurality of programming pulses to the memory cell.

8. The memory device of claim 1, wherein
the plurality of memory cells include means for storing information; or
wherein the memory controller includes means for controlling write operations to the plurality of memory cells.

9. A method, comprising:
controlling write operations to the plurality of memory cells, including, for each bit in each memory cell of the plurality of memory cells that is to be programmed:
- determining whether both bits of the memory cell are being programmed; and
- controlling an application of a plurality of programming pulses to the memory cell to program the bit, wherein
  if both bits of the memory cell are being programmed
  - causing the application of each programming pulse to the bit to occur for a reduced duration
  else
  - causing the application of each programming pulse to the bit to occur for a standard duration, wherein the reduced duration is less than three-fourths of the standard duration.

10. The method of claim 9, wherein determining whether both bits of the memory cell are being programmed is accomplished by employing a page buffer.

11. The method of claim 9, wherein controlling the application of the plurality of programming pulses is accomplished such that the reduced duration is about half of the standard duration.

12. A manufacture including a processor-readable medium having processor-executable code encoded therein, which when executed by one or more processors, enables actions, comprising:
controlling write operations to the plurality of memory cells, including, for each bit in each memory cell of the plurality of memory cells that is to be programmed:
- determining whether both bits of the memory cell are being programmed; and
- controlling an application of a plurality of programming pulses to the memory cell to program the bit, wherein
  if both bits of the memory cell are being programmed
  - causing the application of each programming pulse to the bit to occur for a reduced duration
  else
  - causing the application of each programming pulse to the bit to occur for a standard duration, wherein the reduced duration is less than three-fourths of the standard duration.

13. The manufacture of claim 12, wherein the reduced duration is about half of the standard duration.

* * * * *